United States Patent
Fujisawa et al.

(10) Patent No.: US 7,941,686 B2
(45) Date of Patent: May 10, 2011

(54) PHASE CONTROLLABLE MULTICHANNEL SIGNAL GENERATOR HAVING INTERLEAVED DIGITAL TO ANALOG CONVERTERS

(75) Inventors: Yasumasa Fujisawa, Kanagawa (JP); Raymond L. Veith, Portland, OR (US)

(73) Assignee: Tektronix International Sales GmbH, Rheinfall (CH)

( * ) Notice: Subject to any disclaimer, the term of this patent is extended or adjusted under 35 U.S.C. 154(b) by 177 days.

(21) Appl. No.: 12/472,244

(22) Filed: May 26, 2009

(65) Prior Publication Data

US 2009/0231005 A1   Sep. 17, 2009

Related U.S. Application Data

(62) Division of application No. 11/509,265, filed on Aug. 24, 2006, now Pat. No. 7,562,246.

(30) Foreign Application Priority Data

Aug. 26, 2005   (JP) ................................. 2005-245788

(51) Int. Cl.
*G06F 1/04* (2006.01)

(52) U.S. Cl. ......................... 713/500; 713/300; 713/320

(58) Field of Classification Search ................... 713/300, 713/320, 500; 327/163
See application file for complete search history.

(56) References Cited

U.S. PATENT DOCUMENTS

| | | | |
|---|---|---|---|
| 5,554,945 A | 9/1996 | Lee et al. | |
| 5,668,982 A * | 9/1997 | Davis | 713/600 |
| 6,111,445 A | 8/2000 | Zerbe et al. | |
| 6,351,508 B1 * | 2/2002 | Shishkoff et al. | 375/375 |
| 6,356,224 B1 | 3/2002 | Wohlfarth | |

* cited by examiner

*Primary Examiner* — Nitin C Patel
(74) *Attorney, Agent, or Firm* — William K. Bucher

(57) ABSTRACT

A signal generator can control phase relationship between output signals of the channels without stopping clocks provided to the channels to enable the circuit operation fast. First and second channels 20 and 22 have signal generation blocks 10 and 12 that have clock phase shift circuits 26 and 28, memories, parallel to serial converters and DACs respectively. A phase comparator 24 compares data reading clocks from the signal generation blocks 10 and 12 to produce a phase difference signal wherein the data reading clocks are used to read waveform data from the memories within the signal generation blocks 10 and 12. A CPU controls the clock phase shift circuits 26 and 28 according to the phase difference signal to shift phases of the clocks provided to the signal generation blocks 10 and 12 and then makes phase relationship between the output signals of the first and second channels 20 and 22 as desired.

4 Claims, 5 Drawing Sheets

PHASE CONTROLLABLE MULTICHANNEL SIGNAL GENERATOR HAVING INTERLEAVED DIGITAL TO ANALOG CONVERTERS

This divisional patent application claims priority from U.S. patent application Ser. No. 11/509,265, filed Aug. 24, 2006, now U.S. Pat. No. 7,562,246.

BACKGROUND OF THE INVENTION

The present invention relates generally to signal generators and more specifically to a signal generator that can accurately control phase relationships between output signal channels and provide faster output signals.

During the design of electronic devices, some of the circuits in the device are produced as prototype circuits but other circuits in the device may not have been completed. In such a case, a signal generator can be used to simulate the output of the preceding circuit stage for confirming the operation of the prototype circuit by providing the simulated signals to the prototype circuit.

Some prototype circuits require multiple stimulation signal to be provided to points of the circuit. Therefore, some the signal generators have multiple signal output channels providing synchronized signal outputs between the channels. The signal outputs of the channels may be started by a user initiating an output start operation of the signal generator. The signal generator may receive an external trigger signal and start providing signal outputs from the channels in response to the trigger signal. U.S. Pat. No. 6,356,224 discloses a signal generator having multiple signal output channels.

A typical signal generator has a signal generation block having a waveform memory and digital to analog converter (DAC). The waveform memory stores waveform data representing the output signals. The user can edit the waveform data if necessary. The DAC converts the waveform data into an analog signal output. If the signal generator has multiple signal channels, each of the channels has a signal generation block with the waveform memory being shared by the signal generator blocks.

FIG. 1 is a functional block diagram of a conventional signal generator having multiple signal channels. A start signal is provided to a flip-flop (FF) 18 that controls the ON/OFF status of gate 16. The start signal is provided by a control means that preferably includes a microprocessor, hard disk drive, operation panel, and the like. The start signal is controlled by the control means in response to user input settings. If the start signal transitions from low to high, the Q output of the FF 18 becomes high at the next rising edge of the clock to turn the gate 16 "ON" so that the clock is provided to first and second signal generation blocks 10 and 12 on the next rising edge of the clock. On the other hand, if the start signal transitions from high to low, the Q output of the FF 18 becomes low at the next rising edge of the clock to turn the gate 16 "OFF" so that the clock stops being provided to the first and second signal generation blocks 10 and 12 on the next rising edge of the clock. The signal generator provides signal outputs from the channels at the same time in response to in phase clocks. This signal generator synchronizes the outputs of first and second signal generation blocks 10 and 12 through controlling the clocks that are operation reference for the first and second signal generation blocks 10 and 12. That is, the AND gate 16 controls the clock from a clock oscillator 14 whether it is provided or not to the first and second signal generation blocks 10 and 12.

At slow clock speeds, the synchronization between the channels by the clocks to the signal blocks as shown in FIG. 1 is stable. However if the clock speed is over 100 MHz the operation becomes unstable. This is because rectangular shape of a clock pulse becomes close to a sine wave and when the circuit resumes providing the clock the duty ratio of the clock pulse breaks, and then the logic circuits sometimes recognize the first clock pulse and sometimes not. As the operating speeds of electronic devices increase, there is a need for signal generators to generate output signal with higher frequencies.

PLL (Phase lock loop) or DLL (Delayed Lock Loop) may be used to make the circuit operation faster. The DLL intentionally delays the clock phase up to one period at the maximum to align phases so that there is no delay. But this process cannot be used if the clock is not continuously provided.

Therefore what is desired is to provide stable operation of synchronized signal outputs of channels at faster clock speeds. It is further desirable to provide signal outputs from the channels with user defined phase differences in addition to simultaneous signal outputs. It is also desirable to provide faster signal outputs from the channels.

SUMMARY OF THE INVENTION

In the present invention, clocks are always provided to signal generation blocks and clock phases are controlled to realize stable circuit operation and synchronization of the channels. As an application of the present invention of controlling phase relationships between output signals of the channels, it can generate a signal that has a plurality of levels in one clock by combining the output signals of the channels so that a signal can be generated having time resolution that is substantially higher than the clock speed.

Specifically the signal generator has at least first and second clock phase shifters receiving a common clock signal with the first clock phase shifter generating a first phase shifted clock and the second clock phase shifter generating a second phase shifted clock. The first phase shifted clock is provided to a first signal generating means that is divided to produce a first reading clock for reading first parallel data and converting the parallel data into serial data for generating a first output signal. The second phase shifted clock is provided to a second signal generating means that is divided to produce a second reading clock for reading second parallel data and converting the parallel data into serial data for generating a second output signal. The first and second reading clocks of the first and second signal generating means are provided to phase comparator to produce a phase difference signal. A controller receives the phase difference signal and produces control signals coupled to the first and second clock phase shifter for controlling phases of the first and second phase shifted clocks according to the phase difference signal and phase relationships between the output signals of the first and second signal generating means.

Each of the signal generating means has a first divider receiving the corresponding first and second phase shifted clocks and generates a corresponding divided clock. A second divider receives the corresponding divided clock and generates one of the respective first and second reading clocks. A memory receives and stores the respective first and second parallel data. A memory controller receives the corresponding first and second reading clock for storing and retrieving the corresponding first and second parallel data with the memory controller retrieving n sets of corresponding first and second parallel data. A parallel to serial converter receives the n sets of corresponding first and second parallel data, the corresponding first and second phase shifted clock, the corresponding divided clock and the corresponding reading clock and converts the corresponding parallel data to corresponding n sets of serial data. A digital to analog converter having n inputs receives one of the corresponding n sets of serial data at each of the n inputs and the corresponding first and second phase shifted clock and generates an analog signal corresponding to one of the first and second output signals.

In one embodiment, the digital to analog converter has a zeroing stage coupled to each of the n inputs that receives one of the corresponding n sets of serial data and the corresponding first and second phase shifted clock. Each zero stage generates a data bit of the serial data for a portion of the corresponding first and second phase shifted clock and a zero level for another portion of the corresponding first and second phase shifted clock.

The zeroing stage may be implemented with a latch receiving one of the corresponding n sets of serial data and the corresponding first and second phase shifted clock for generating a data bit of the serial data in response to the corresponding first and second phase shifted clock. A duty cycle modifier receives the corresponding first and second phase shifted clock and commands from the controller for generating a variable duty cycle clock output of the corresponding first and second phase shifted clock. A multiplexer having a first input receives the data bits from the latch and a second input coupled to a zero reference. An output is selectively coupled to one of the first and second input in response to the a variable duty cycle clock output of the corresponding first and second phase shifted clock. The multiplexer outputs the data bit for a desired portion of one clock cycle of the variable duty cycle clock and outputs the zero reference for another desired portion of one clock cycle of the variable duty cycle clock.

In an further embodiment, the zeroing stage has a latch gate receiving one of the corresponding n sets of serial data and the corresponding first and second phase shifted clock for generating a data bit of the serial data in response to the corresponding first and second phase shifted clock. A duty cycle modifier receives the corresponding first and second phase shifted clock and commands from the controller for generating a variable duty cycle clock output of the corresponding first and second phase shifted clock. A logic gate having a first input receives the data bits from the latch and a second inverting input receives the variable duty cycle clock output of the corresponding first and second phase shifted clock. The logic gate outputs the data bit for a desired portion of one clock cycle of the variable duty cycle clock and outputs a zero reference for another desired portion of one clock cycle of the variable duty cycle clock.

The digital to analog converter with the zeroing stage is preferably used with means for combining the first and second output signals of the first and second signal generating means into a combined output signal. Each of the first and second signal generating means generates the corresponding first and second output signal that has the data bit level for the desired portion of the one clock cycle of the variable duty cycle clock and the zero reference level for the other desired portion of the one clock cycle of the variable duty cycle clock. The controller controls the phase relationships of the first and second output signals of the first and second signal generating means such that the data bits and the reference levels of the first and second signal outputs do not overlap in the combined output signal.

The objects, advantages and other novel features of the present invention are apparent from the following detailed description when read in conjunction with the appended claims and attached drawings.

DETAILED DESCRIPTION OF THE INVENTION

Figure 1:
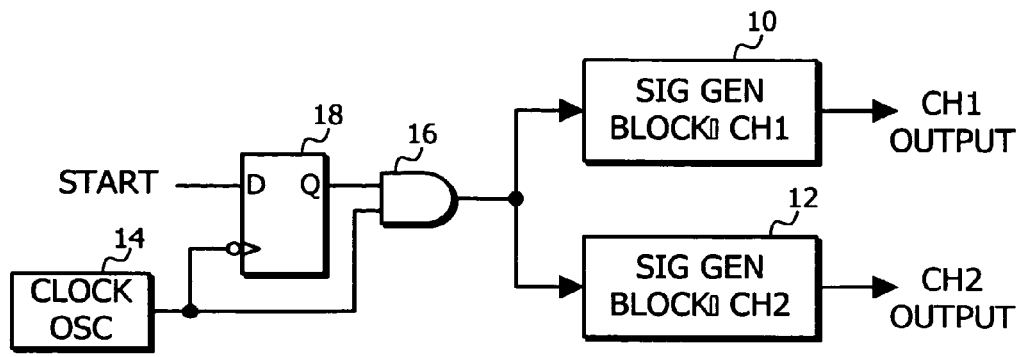
FIG. 1 is a functional block diagram of an example of a conventional signal generator that has a plurality of channels.
Figure 2:
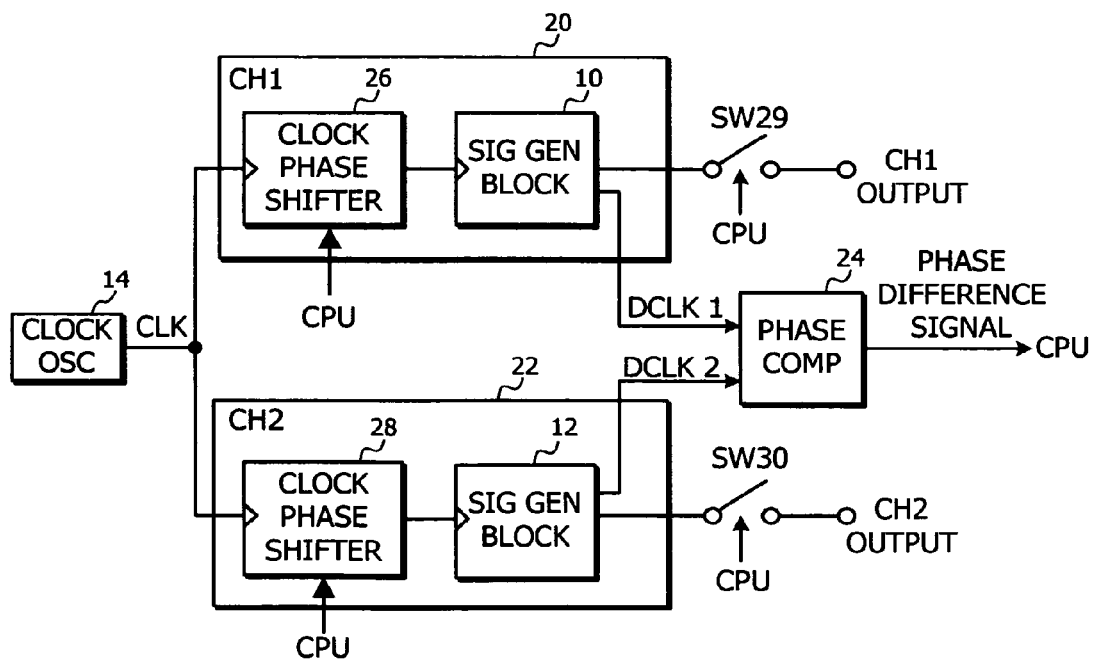
FIG. 2 is a functional block diagram of an example of a signal generator according to the present invention.

FIG. 2 is a functional block diagram of an example of a signal generator according to the present invention. The signal generator has a control means that includes a central processing unit (CPU), such as a microprocessor, RAM memory, hard disk drive (HDD), keyboard, and the like, which are not shown. The signal generator operates under program control using programs stored in the RAM memory or on the hard disk drive. The signal generator has outputs channels CH1 OUTPUT and CH2 OUTPUTS providing signal outputs that may be started by a user initiating an output start operation of the signal generator. An external trigger input terminal (not shown) may be provided that operates in conjunction with the control means to control the start of the signal outputs according to an external trigger signal. In the following descriptions, similar elements from previous drawing figure are labeled the same.

FIG. 2 shows an example the signal generator providing signal outputs from first and second channels 20 and 22. The number of the channels, however, can be N (N is a natural number). The first channel 20 has a signal generation block 10 and a clock phase shift circuit 26. Similarly, the second channel 22 has a signal generation block 12 and a clock phase shift circuit 28. A clock oscillator 14 provides a clock CLK to the clock phase shift circuits 26 and 28. Clocks shifted by the clock phase shift circuits 26 and 28 are referred to as "phase shifted clocks" hereinafter and are provided to the respective signal generation blocks 10 and 12 to determine the timing of output waveform data from the signal generator blocks 10 and 12. A phase comparator 24 compares divided clocks from the channels 20 and 22 and produces a phase difference signal depending on the phase difference. If there are three or more channels, phase comparators are similarly provided to produce phase difference signals between adjacent channels. The CPU (not shown) receives the phase difference signal and produces I and Q control signals for the clock phase shift circuits 26 and 28 of the respective channels 20 and 22 to control phase shift of the clocks.

Relay switches 29 and 30 switch the outputs of the signal generation blocks 10 and 12 provided to the respective output terminals according to CPU control. For example, during the initial power-up sequence, the signal generation blocks are controlled to provide calibration signals to adjust phase relationship between the channels. The relay switches 29 and 30 are open during the calibration period to prevent the calibration signal from being output at the output terminals.

Figure 3:
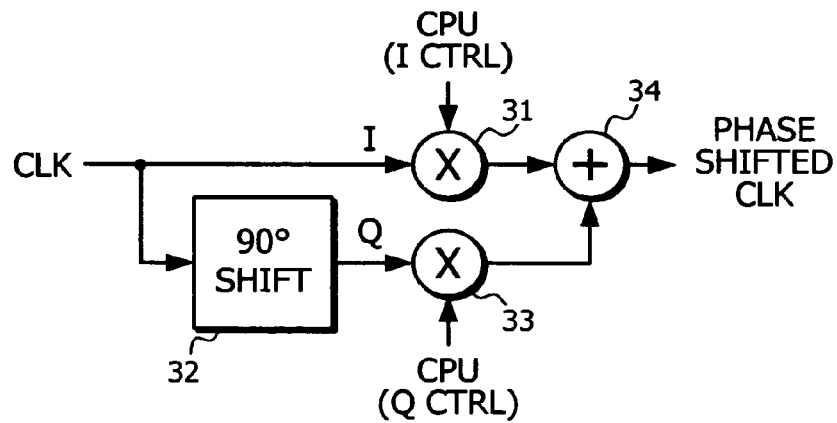
FIG. 3 is a block diagram of an example of a phase shift circuit according to the present invention.

FIG. 3 shows an example of the clock phase shift circuits 26 and 28 that may be an IQ modulator. The clock from the clock oscillator 14 is provided to a first multiplier 31 and a ninety-degree phase shifter 32. The first multiplier 31 receives the I control signal from the CPU to produce an I component. The ninety-degree phase shifter 32 shifts the clock phase by ninety degrees and provides it to a second multiplier 33. The second multiplier 33 receives the Q control signal to produce a Q component. An adder 34 adds the I and Q components. The CPU changes the weights of the I and Q control signals from −1 to +1 to delay the clock phase up to an arbitrary angle of 360 degrees. For example, if the weight coefficients of the I and Q control signals are −1 and 0 respectively, the clock phase delays 180 degrees. If the weight coefficients of the I and Q control signals are 0 and −1 respectively, the clock phase delays 270 degrees. The phase shift circuit is also called as a phase Interpolator and it is disclosed in U.S. Pat. No. 5,554,945 and U.S. Pat. No. 6,111,445.

Figure 4:
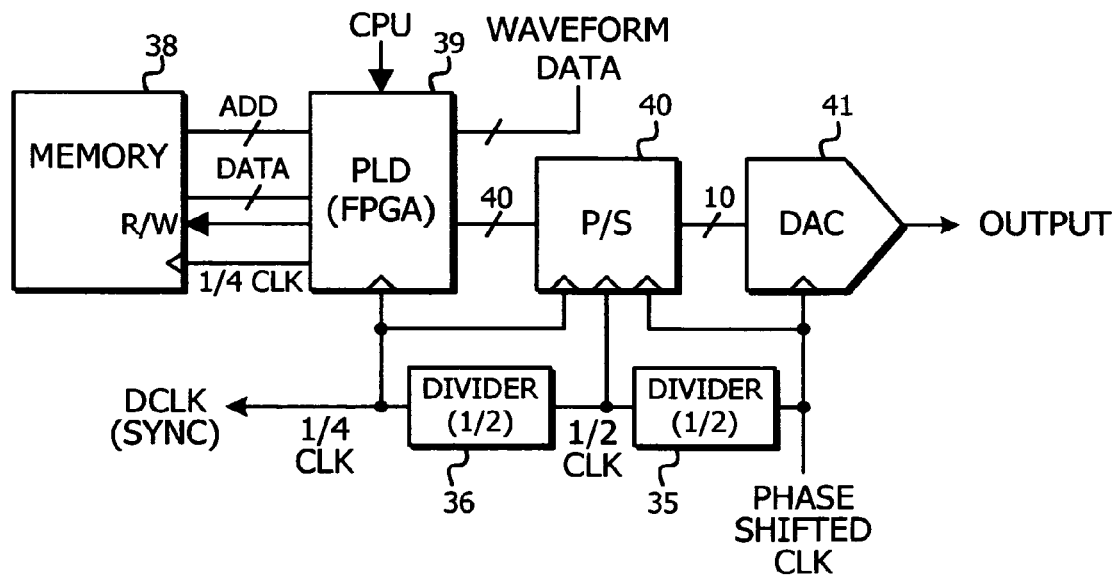
FIG. 4 is a block diagram of an example of a signal generation block according to the present invention.

FIG. 4 is a block diagram of an example of the signal generation blocks 10 and 12. In this example, the phase shifted clock is sequentially divided by two by dividers 35 and 36 and the ¼ divided clock is provided to a programmable logic device (PLD) 39. The PLD 39 may be FPGA that features functions of address counter, register, and the like, and provides addresses and a R/W (read/write) signal to a memory 38 to control write and read of waveform data according to the CPU control. Memory 38 receives the waveform data and clock through the PLD 39. The PLD 39 reads ten sets of four bit parallel data (waveform data) at a time from the memory 38 according to the ¼ divided clock (DCLK). A parallel to serial converter (P/S) 40 receives the waveform data from the PLD 39 according to the ¼ divided clock and converts it into 2 bit parallel data by sequentially applying the ½ divided clock. The two bit parallel data is converted to one bit serial data by applying the phase shifted clock which is four time faster than ¼ divided clock (DCLK). The parallel to serial conversion covers slow reading speed of the memory 38 to produce the fast data. The PDL 39 outputs the individual ten bit serial data streams as ten bit parallel data to a digital to analog converter (DAC) 41 which converts the ten bit parallel data to an analog output signal.

The ¼ divided clock DCLK is also provided to the phase comparator 24 for comparing the phases between the signal generation blocks of the different channels. The alignment of the phases of the divided clocks means that sets of four bit parallel data from the signal generation blocks are read in synch. This allows synchronizing the signal outputs from the channels. Alternatively, if it is required to make the signal generation blocks provide signal outputs that have an intentional phase difference to each other, the ¼ divided clock DCLKs from the signal generation blocks are controlled to have a desired phase difference. It is useful in some applications that an intentional skew be applied between the output signals. The phase difference signals corresponding to the respective desired phase differences between the channels can be preprogrammed during manufacturing.

Figure 5:
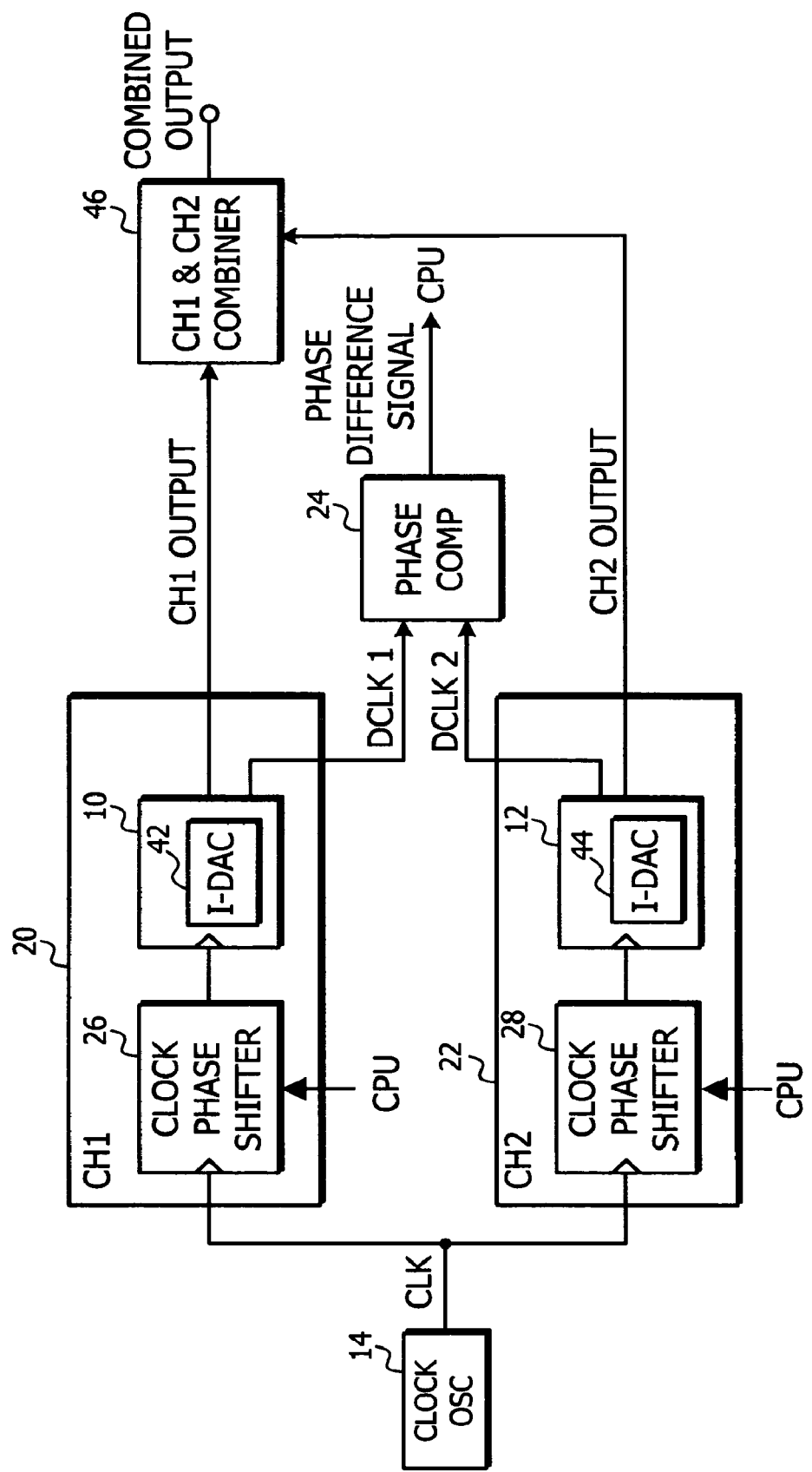
FIG. 5 is a functional block diagram of another example of a signal generator that is an application of phase shift between channels according to the present invention.

FIG. 5 is a functional block diagram of further embodiment of a signal generator having phase adjusted output signals between channels. FIG. 5 shows an example where the phase adjusted output signals from two channels are combined to produce an output signal equivalent to a signal generated at twice clock speed or at twice the time resolution. Three or more channels can be realized in a similar manner.

Figure 6:
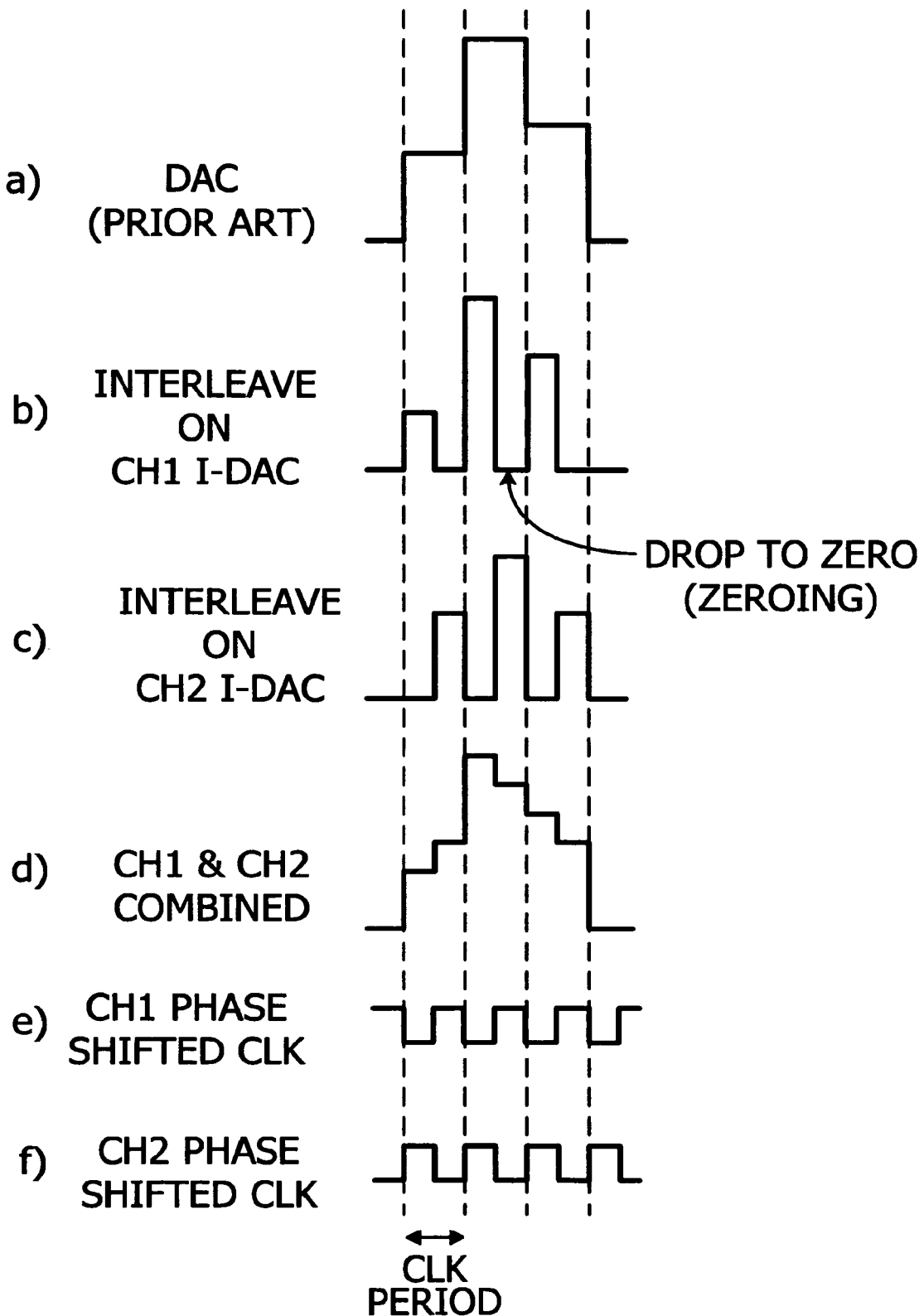
FIG. 6 is waveform chart showing timing relationship of signals.

Signal generation blocks 10 and 12 of the channels 20 and 22 have respective interleaved digital to analog converters (hereinafter called "I-DACs") in place of the usual digital to analog converter (DAC) 41 as shown in FIG. 4. FIG. 6a is an output waveform of a conventional DAC. FIGS. 6b and 6c are output signals of the respective I-DACs according to the present invention. FIG. 6d is a waveform combining the output signals of the two signal generator blocks I-DACs. FIGS. 6e and 6f are phase shifted clocks provided to the signal generator blocks 10 and 12 of the first and second channels respectively. The interval between dotted lines shows one clock cycle. Relative to the conventional DAC shown in FIG. 6a, the I-DAC provides a desired level for a half cycle (1/N cycle of N channel outputs are combined where N is a natural number) of the one cycle according to user settings and drops the level to zero (reference level) for the remaining cycle. An output from the first I-DAC 42 of the first channel 20 has a desired level for the first half of the one clock cycle and an output from the second I-DAC 44 of the second channel 22 has a desired level for the second half of the one clock cycle.

In case of N channels, the clock cycle is divided into N sections to which output signals from the channels correspond. The output signals from the signal generation blocks of the N channels have desired levels for the respective sections of the N sections in the clock cycle and are controlled to be zero levels (reference levels) for other sections. The reason for keeping the output signal at a zero level for the sections other than the desired level section is that if there are levels for some sections it is difficult to control the combined levels as desired.

The CPU receives the phase difference signal from the phase comparator 24 and adjusts phase relationship between the first and second divided clock DCLK1 and DCLK2 to make the output signals of the first and second I-DAC have phase relationship of a half cycle (180 degrees) difference. The setting of the phase relationship of the phase difference signal is determined at the time of manufacturing of the generator.

A power combiner 46 combines the output signals of the first and second channels and provides a signal that has two levels in the one clock cycle as shown in FIG. 6d. That is, it produces a signal of twice the resolution relative to the clock frequency. The resolution of the combined output signal is N time greater if N channels are combined.

Figure 7:
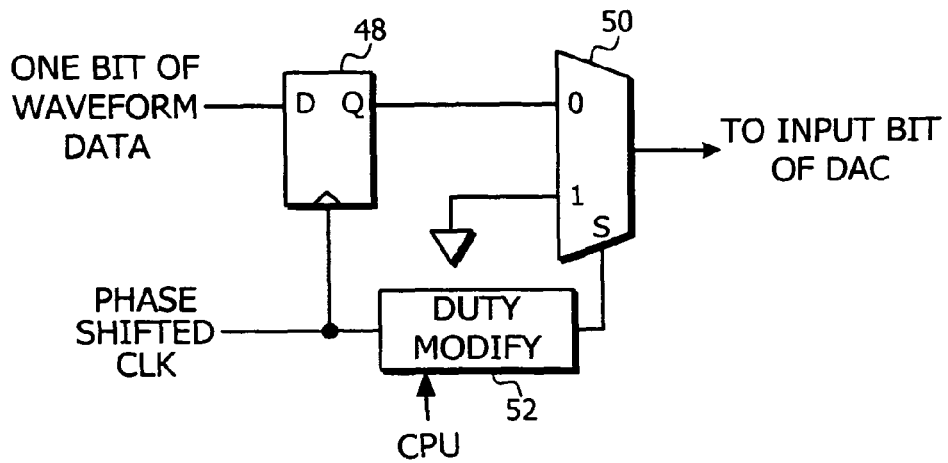
FIG. 7 is a block diagram of an example of a zeroing stage according to the present invention.

FIG. 7 is a block diagram of an example of a zeroing stage according to the present invention. The zeroing stage is provided to each of the parallel data input terminals of a typical DAC to make the typical DAC into the I-DAC 41. Each bit of the waveform data (parallel data) from the P/S 40 is provided to the D input of a flip-flop (FF) 48 and the value is held by the FF 48 at rising edges of the phase shifted clock provided to the channel and then the value is provided to a multiplexer 50 from the Q output. The phase shifted clock is also provided to a duty modifier 52 that modifies the duty cycle of the phase shifted clock in response to commands provided by the CPU. The CPU interprets user provided instructions for combining multiple channels into commands for the duty modifier. The multiplexer 50 selects a ground side when the output of the duty modifier 52 is high (logic "1") and selects the Q output of the FF 48 when it is Low (logic "0").

In a first example where the signal generator has two channels, the duty cycle ratio of the phase shifted clock is 50% and the duty modifier 52 does not modify the duty cycle ratio of the phase shifted clock and outputs the phase shifted clock as is. In case of the phase shifted clock being low for the second half of the cycle, the multiplexer 50 selects the ground to output zero level for the first half of the cycle and outputs the data bit from the FF 48 for the second half of the cycle. Therefore the I-DAC receiving the data provides a signal having a desired level for the second half of the clock cycle as shown in FIG. 6c. Similarly, in case of the phase shifted clock being low for the first half of the cycle, it provides a waveform as shown in FIG. 6b.

Figure 8:
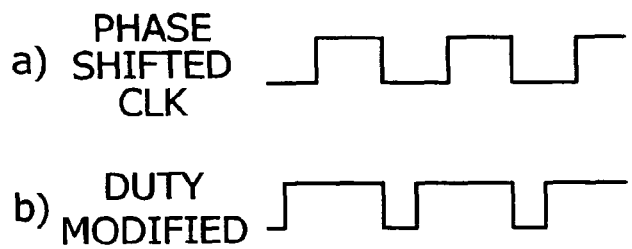
FIG. 8 is waveform chart showing timing relationship between a phase shifted clock and an output of a duty modifier.

In the next example where the signal generator has four channels, the duty modifier 52 modifies the duty cycle ratio of the phase shifted clock to be 75%. FIG. 8 is waveform chart showing timing relationship between the phase shifted clock and the output of a duty modifier for the case of four channels. The multiplexer 50 provides the Q output of the FF 48 to the DAC during the duration of ¼ (25%) of the clock cycle that the output of the duty modifier is low and provides zero during the other duration of the clock cycle. The phase shifted clocks provided to the respective four channels are shifted by 90 degrees in phase to each other so that the respective portions having desired levels of the four channel outputs do not overlap. Similarly, in case of a signal generator having N channels, the zeroing stage provides the Q output of the FF 48 to the DAC during 1/N of the clock cycle.

Figure 9:
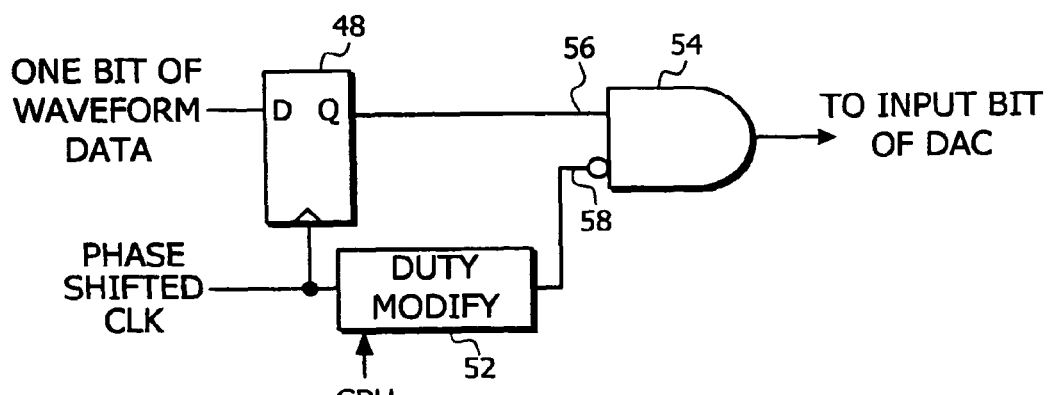
FIG. 9 is a block diagram of another example of a zeroing stage according to the present invention.

FIG. 9 is a block diagram of another example of a zeroing stage according to the present invention. The different point from FIG. 7 is that zeroing stage uses an AND gate 54 in place of the multiplexer 50. An input terminal 58 is an inverted input so that a signal provided to an input terminal 56 passes the AND gate 54 only when the duty modifier 52 output is low. As a result, it performs the same operation as the multiplexer 50 of FIG. 7.

The combining of the channel outputs by the zeroing stage is effective for making the combined levels be as accurate as desired. However, if the accuracy of the combined levels is not very severe the zeroing stage may not be essential. The use of the zeroing stage sometimes tends to bring about unwanted ripples by ringing at the level switching. As for this point, simple combining of the outputs by just making a phase difference between the channels easily produces a combined signal having levels in the one clock without the ripples. In this case and if there are N channels, the phase difference between the channels is 1/N of the one cycle and the output signals are controlled not to overlap each other.

As described, the present invention can control phase relationship between channel outputs of a signal generator as desired. As an application of the present invention, the signal generator generates output signals each of which has a desired level for a desired section in a clock cycle and has a reference level for the other section. Further, the phases of phase shifted clocks of the signal generation blocks of the respective channels are controlled so as not to overlap the desired levels of the other output signals. Then the output signals are combined to produce a signal that has a plurality of levels in the one clock cycle. This makes it possible to generate an output signal of which time resolution is higher than the clock frequency.

Although the invention has been disclosed in terms of the preferred and alternative embodiments disclosed herein, those skilled in the art will appreciate that modifications and improvements may be made without departing from the scope of the invention.

What is claimed is:

1. A signal generator comprising:
    a plurality of signal generating means for generating analog output signals with each signal generating means having an interleaved digital to analog converter generating an analog output signal having a desired level for a portion of a clock cycle and a reference level for another portion of the clock cycle,
    means for controlling phases of each clock cycle provided to the respective signal generating means to control phase relationships of the clock cycles so as not to overlap the desired levels of each of the analog output signals of the plurality of signal generating means, and
    means for combining the analog output signals of the plurality of signal generating means into an output signal wherein the desired level of the analog output signal of each of the signal generating means is aligned with the reference levels of the other signal generating means.

2. The signal generator as recited in claim 1 wherein each of the interleaved digital to analog converters further comprises a zeroing stage coupled to each of n inputs of the interleaved digital to analog with each zeroing stage receiving one bit of n bit parallel data and the phase shifted clock cycle, with each zero stage generating a data bit of the n bit parallel data for a portion of the phase shifted clock cycle and a zero reference level for another portion of the phase shifted clock cycle.

3. The signal generator as recited in claim 2 wherein the zeroing stage further comprises:
    a latch receiving one bit of n bit of parallel data and the phase shifted clock cycle and generating a data bit of the n bit parallel data in response to the phase shifted clock cycle;
    a duty cycle modifier receiving the phase shifted clock cycle and commands from a controller for generating a variable duty cycle clock cycle; and
    a multiplexer having a first input receiving the data bit from the latch and a second input coupled to a zero reference and an output selectively coupled to one of the first and second inputs in response to the variable duty cycle clock cycle wherein the multiplexer outputs the data bit for a portion of variable duty cycle clock cycle and outputs the zero reference level for the another portion of the variable duty cycle clock cycle.

4. The signal generator as recited in claim 2 wherein the zeroing stage further comprises:
    a latch gate receiving one data bit of n bit parallel data and the phase shifted clock cycle and generating a data bit of the n bit parallel data in response to the phase shifted clock cycle;
    a duty cycle modifier receiving the phase shifted clock cycle and commands from the controller for generating a variable duty cycle clock cycle of the phase shifted clock cycle; and
    a logic gate having a first input receiving the data bit from the latch and a second inverting input receiving the variable duty cycle clock output of the phase shifted clock wherein the logic gate outputs the data bit for a portion of variable duty cycle clock cycle and outputs a zero reference level for another portion of the variable duty cycle clock cycle.

* * * * *